US011946881B2

(12) United States Patent
Priwisch et al.

(10) Patent No.: US 11,946,881 B2
(45) Date of Patent: Apr. 2, 2024

(54) INSPECTION APPARATUS AND INSPECTION METHOD USING SAME

(71) Applicant: SAMSUNG ELECTRONICS CO., LTD., Suwon-si (KR)

(72) Inventors: Martin Priwisch, Hwaseong-si (KR); Jongmin Yoon, Incheon (KR); Suhwan Park, Incheon (KR); Junbum Park, Goyang-si (KR); Inkeun Baek, Suwon-si (KR); Wonki Lee, Suwon-si (KR); Ikseon Jeon, Suwon-si (KR); Kwangrak Kim, Gunpo-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 211 days.

(21) Appl. No.: 17/719,842

(22) Filed: Apr. 13, 2022

(65) Prior Publication Data
US 2022/0412898 A1 Dec. 29, 2022

(30) Foreign Application Priority Data

Jun. 23, 2021 (KR) ........................ 10-2021-0081797

(51) Int. Cl.
G01N 22/02 (2006.01)
G01R 1/067 (2006.01)
H01L 21/66 (2006.01)

(52) U.S. Cl.
CPC .............. *G01N 22/02* (2013.01); *H01L 22/12* (2013.01)

(58) Field of Classification Search
CPC .... G01N 22/02; G01N 21/95; G01N 21/9501; G01N 21/9505; G01N 2001/2291; G01N 2001/2285; G01N 21/3586; H01L 22/12; H01L 22/66; G01R 31/311; G01R 1/073; G01R 1/07314; G01R 1/07392; G01R 31/2887
See application file for complete search history.

(56) References Cited

U.S. PATENT DOCUMENTS

| 5,499,963 | A | 3/1996 | Fujimoto et al. |
| 7,024,783 | B2 | 4/2006 | Trull et al. |
| 9,339,905 | B2 | 5/2016 | Murota |
| 10,690,596 | B2 | 6/2020 | Nakamura et al. |
| 10,907,952 | B2 | 2/2021 | Li et al. |
| 2019/0227006 | A1 | 7/2019 | Ogata et al. |
| 2020/0371082 | A1 | 11/2020 | Lalovic |

FOREIGN PATENT DOCUMENTS

JP 5415714 B2 2/2014

*Primary Examiner* — Son T Le
(74) *Attorney, Agent, or Firm* — Sughrue Mion, PLLC

(57) ABSTRACT

An inspection apparatus includes an inspection signal source configured to irradiate a wafer with an inspection ray having a frequency in a range of 0.1 terahertz (THz) to 10 THz, a curved rail, a probe mount configured to move along the curved rail, and first and second probes coupled to the probe mount, wherein the first probe is configured to detect the inspection ray transmitted through the wafer, and the curved rail has a curved surface convex toward the first and second probes.

20 Claims, 6 Drawing Sheets

INSPECTION APPARATUS AND INSPECTION METHOD USING SAME

CROSS-REFERENCE TO RELATED APPLICATION

This application is based on and claims priority under 35 U.S.C. § 119 to Korean Patent Application No. 10-2021-0081797, filed on Jun. 23, 2021, in the Korean Intellectual Property Office, the disclosure of which is incorporated by reference herein in its entirety.

BACKGROUND

The disclosure relates to an inspection apparatus and an inspection method using the same, and more particularly, to an inspection apparatus and an inspection method using the same for inspecting a wafer and/or a semiconductor package using electromagnetic waves in a terahertz band.

Recently, as technology for generating and detecting terahertz waves has rapidly developed, THz-related application research has been conducted in various fields such as biology, chemistry, mechanical engineering, and radio communication engineering. Unlike X-ray causing damage and/or change in properties of a sample or an object to be inspected due to strong energy, terahertz waves, which are non-ionizing electromagnetic waves with low energy, have a low probability of changing or damaging the physical properties of an object to be inspected. Accordingly, terahertz wave inspection has been applied to various non-contact and non-destructive inspection fields.

A representative application of terahertz waves in the semiconductor industry is quality evaluation of integrated circuits and semiconductor packages. Although the terahertz waves cannot transmit through a metal pattern formed inside a semiconductor chip, the terahertz waves may easily transmit through a polymer material inside a package, and thus, the terahertz waves may be applied to package inspection. In addition, an inspection method using terahertz waves does not need to provide a medium because terahertz waves may proceed in free space, and the inspection method may be easily applied to a non-contact type inline process because there is no need to directly contact an inspection target.

SUMMARY

The disclosure provides an inspection apparatus having improved reliability and inspection rate, and a semiconductor device inspection method using the same.

In accordance with an aspect of the disclosure, an inspection apparatus includes an inspection signal source configured to irradiate a wafer with an inspection ray having a frequency in a range of about 0.1 terahertz (THz) to 10 THz; a curved rail; a probe mount configured to move along the curved rail; and a first probe and a second probe coupled to the probe mount, wherein the first probe is configured to detect the inspection ray transmitted through the wafer, and wherein the curved rail has a curved surface that is convex toward the first probe and the second probe.

In accordance with an aspect of the disclosure, an inspection apparatus includes an inspection signal source configured to irradiate a wafer with an inspection ray having a frequency in a range of 0.1 terahertz (THz) to 10 THz; an L-shaped arm configured to move along a curved rail; a probe mount coupled to the L-shaped arm; and a first probe and a second probe coupled to the probe mount, wherein the first probe is configured to detect the inspection ray transmitted through the wafer, and wherein the curved rail has a curved surface that is concave toward the L-shaped arm.

In accordance with an aspect of the disclosure, a method of manufacturing a semiconductor device includes aligning a first probe in an inspection position for inspecting a wafer; irradiating the wafer with a first inspection ray having a frequency in a range of 0.1 terahertz (THz) to 10 THz and, using the first probe, detecting the first inspection ray transmitted through the wafer to inspect the wafer; moving the first probe to a position apart from the inspection position and aligning a second probe different from the first probe in the inspection position; and using the second probe, irradiating the wafer with a second inspection ray having the frequency in the range of 0.1 THz to 10 THz and, using the second probe, detecting a detection signal reflected by the wafer to inspect the wafer, wherein the first probe and the second probe are mounted on a probe mount configured to move along a curved rail, and wherein the curved rail has a curved surface that is convex toward the first probe and the second probe.

BRIEF DESCRIPTION OF THE DRAWINGS

Embodiments of the disclosure will be more clearly understood from the following detailed description taken in conjunction with the accompanying drawings in which.

DETAILED DESCRIPTION OF EMBODIMENTS

Figure 1:
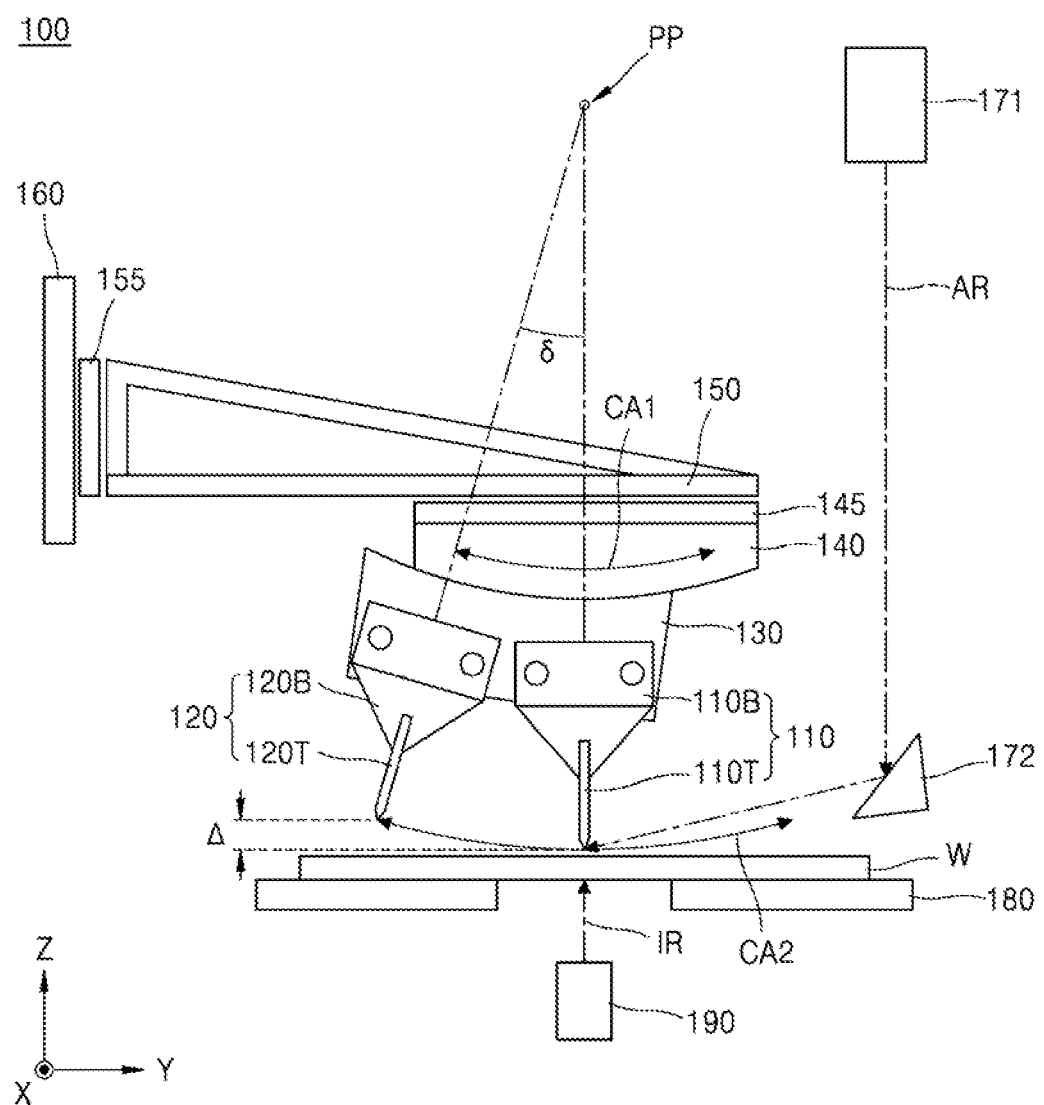
FIG. 1 is a schematic view illustrating an inspection apparatus according to example embodiments.

Hereinafter, embodiments of the disclosure will be described in detail with reference to the accompanying drawings. The same reference numerals are used for the same components in the drawings, and repeated descriptions thereof are omitted.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

FIG. 1 is a schematic view illustrating an inspection apparatus 100 according to example embodiments.

Referring to FIG. 1, the inspection apparatus 100 may include first and second probes 110 and 120, a probe mount 130, a curved rail 140, a horizontal stage 145, a horizontal rail 150, a vertical stage 155, a vertical rail 160, an alignment signal source 171, a mirror 172, an inspection stage 180, and an inspection signal source 190.

The inspection apparatus 100 may non-destructively inspect an inspection target, such as a wafer W, for example. The inspection target of the inspection apparatus 100 is not limited to the wafer W and may include individualized and packaged semiconductor devices.

Hereinafter, an example in which a device under test inspection by the inspection apparatus 100 is the wafer W is mainly described, but the inspection apparatus 100 may be used for inspecting semiconductor chips and semiconductor packages.

Here, two directions parallel to an upper surface of the wafer W and perpendicular to each other are defined as an X direction and a Y direction, respectively, and a direction perpendicular to the upper surface of the wafer W is defined as a Z direction. Unless otherwise specified, the above definition of the directions is the same in the description and drawings below.

Here, the wafer W may include, for example, silicon (Si). The wafer W may include a semiconductor element such as germanium (Ge) or a compound semiconductor such as silicon carbide (SiC), gallium arsenide (GaAs), indium arsenide (InAs), and indium phosphide (InP). According to some embodiments, the wafer W may have a silicon on insulator (SOI) structure. The wafer W may include a buried oxide layer. According to some embodiments, the wafer W may include a conductive region, for example, a well doped with impurities. According to some embodiments, the wafer W may have various device isolation structures such as shallow trench isolation (STI) for separating the doped wells from each other.

The inspection apparatus 100 may inspect the wafer W on which a certain process has been performed. Here, the certain process may include various processes of forming a semiconductor device. The certain process includes, for example, an ion doping process, an oxidation process for forming an oxide film, spin coating, a lithography process including exposure and development, a thin film deposition process including chemical vapor deposition (CVD), atomic layer deposition (ALD), and physical vapor deposition (PVD), a dry etching process, a wet etching process, and a metal interconnection process.

According to example embodiments, the inspection apparatus 100 may be an inline inspection apparatus included in various wafer processing apparatuses. Accordingly, the inspection apparatus 100 may inspect the wafer W processed by a wafer processing apparatus in real time. The wafer processing apparatus may include various equipment such as a stepper-type or scanner-type exposure apparatus, dry/wet etching equipment, plasma etching equipment, cleaner equipment, plasma asher equipment, polishing equipment such as chemical mechanical polishing (CMP), ion injection equipment, PVD equipment, CVD equipment, ALD equipment, annealing equipment, and the like. However, the disclosure is not limited thereto, and the inspection apparatus 100 may be separately provided outside the wafer processing apparatus.

The inspection apparatus 100 may be, for example, a terahertz time domain spectrometer. The inspection apparatus 100 may inspect the wafer W by providing a signal having a certain frequency band within a terahertz range (e.g., about 0.1 THz to about 10 THz) to the wafer W and then detecting a frequency-intensity distribution of the signal reflected and/or transmitted by the wafer W.

The inspection of the wafer W may be performed by comparison with a terahertz time domain spectrum for a standard wafer W. The inspection of the wafer W may be a scanning inspection of the entire surface of the wafer W or a spot inspection of a partial region of the wafer W.

The inspection apparatus 100 may operate in a reflection mode or a transmission mode. In the transmission mode, the inspection signal source 190 may irradiate one surface of the wafer W with an inspection ray IR (e.g., a first inspection ray) of a terahertz band, and the inspection ray IR passing through the wafer W may be detected by the first probe 110. In the reflection mode, the second probe 120 may provide an inspection signal (e.g., a second inspection ray) to the wafer W, and the second probe 120 may detect a signal reflected by the wafer W.

Here, structures of the first and second probes 110 and 120 are described in detail with reference to FIGS. 2 and 3.

Figure 2:
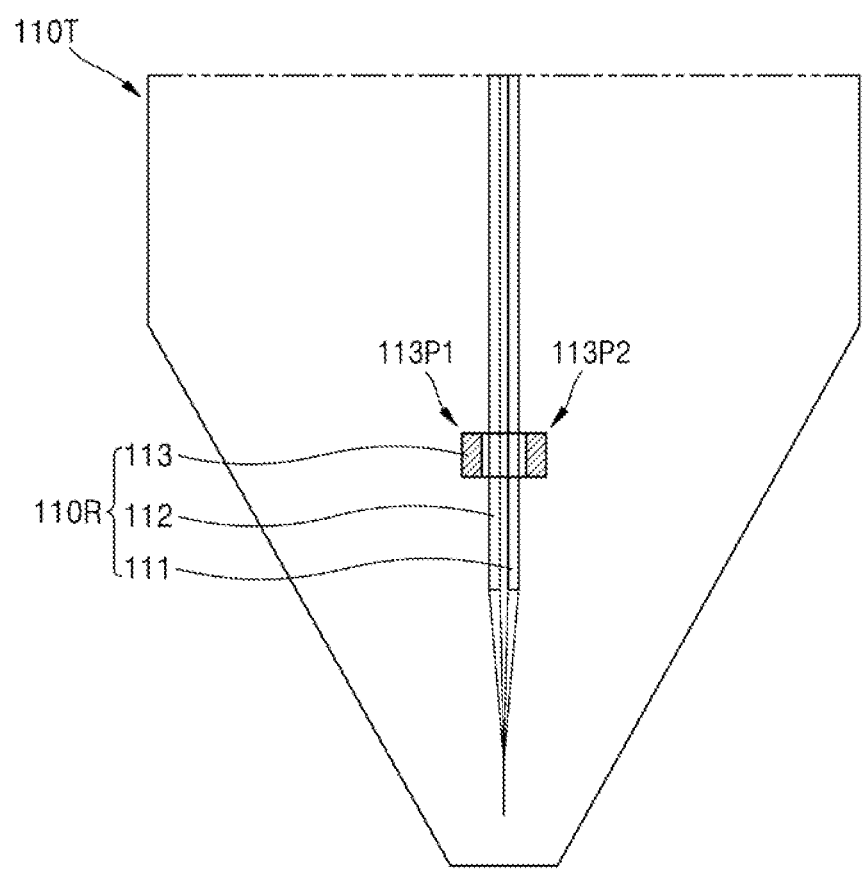
FIG. 2 is a partial cross-sectional view of a first probe tip included in an inspection apparatus.

FIG. 2 is a partial cross-sectional view of a first probe tip 110T included in the inspection apparatus 100.

Referring to FIGS. 1 and 2, the first probe 110 may include the first probe tip 110T and a first probe body 110B. A receiver 110R for detecting inspection ray IR passing through the wafer W may be embedded in the first probe tip 110T. The first probe body 110B may fix and mechanically support the first probe tip 110T and may provide an electrical path for reading a signal detected by the receiver 110R.

The receiver 110R may be, for example, a dipole antenna. The receiver 110R may include first and second electrodes 111 and 112 and a first photo switch 113 connected to the first and second electrodes 111 and 112. The first photo switch 113 may generate a photoelectric signal in response to an alignment ray (AR) reaching the first probe tip 110T.

The first probe 110 may be aligned in an inspection position based on the photoelectric signal generated by the first photo switch 113. According to example embodiments, when a position of the first photo switch 113 is arranged on a path of the alignment ray AR, the photoelectric signal generated by the first photo switch 113 may be maximized in size. By adjusting a position of the first probe 110 so that the photoelectric signal generated by the first photo switch 113 is maximized, a position of the receiver 110R included in the first probe tip 110T may be precisely aligned.

According to example embodiments, the first photo switch 113 may include a first portion 113P1 and a second portion 113P2. Each of the first portion 113P1 and the second portion 113P2 may generate a photoelectric signal in response to the alignment ray AR. Accordingly, an intensity graph of the photoelectric signal generated by the first photo switch 113 according to a spatial position of the first probe 110 may include two local maxima. One of the local maxima may correspond to the first portion 113P1, and the other may correspond to the second portion 113P2. Any one of the two local maxima may appear when the first portion 113P1 is on the path of the alignment ray AR, and the other of the two local maxima may appear when the second portion 113P2 is on the path of the alignment ray AR.

When the first probe 110 is aligned based on the photoelectric signal generated by the first portion 113P1, spatial resolution based on the first probe 110 may be increased. When the first probe 110 is aligned based on the photoelectric signal generated by the second portion 113P2, the sensitivity of the measurement by the first probe 110 (i.e., intensity of the signal measured by the first probe 110 based on the same inspection ray IR) may be increased. According to example embodiments, the first probe 110 may be aligned to increase spatial resolution based on the photoelectric signal generated by the first portion 113P1 or may be aligned to increase the sensitivity of measurement based on the photoelectric signal generated by the second portion 113P2.

In the related art, the probe and the probe tip are aligned by an image based method using a camera. Because the center of the probe and the center of the receiver included in the probe tip may not match each other due to error tolerance during probe manufacturing, the probe tip may be precisely aligned but the receiver may be inaccurately aligned.

According to example embodiments, by aligning the first probe 110 based on the position of the first photo switch 113 included in the receiver 110R, the reliability of the alignment of the first probe 110 and the reliability of the inspection using the first probe 110 may be improved.

Figure 3:
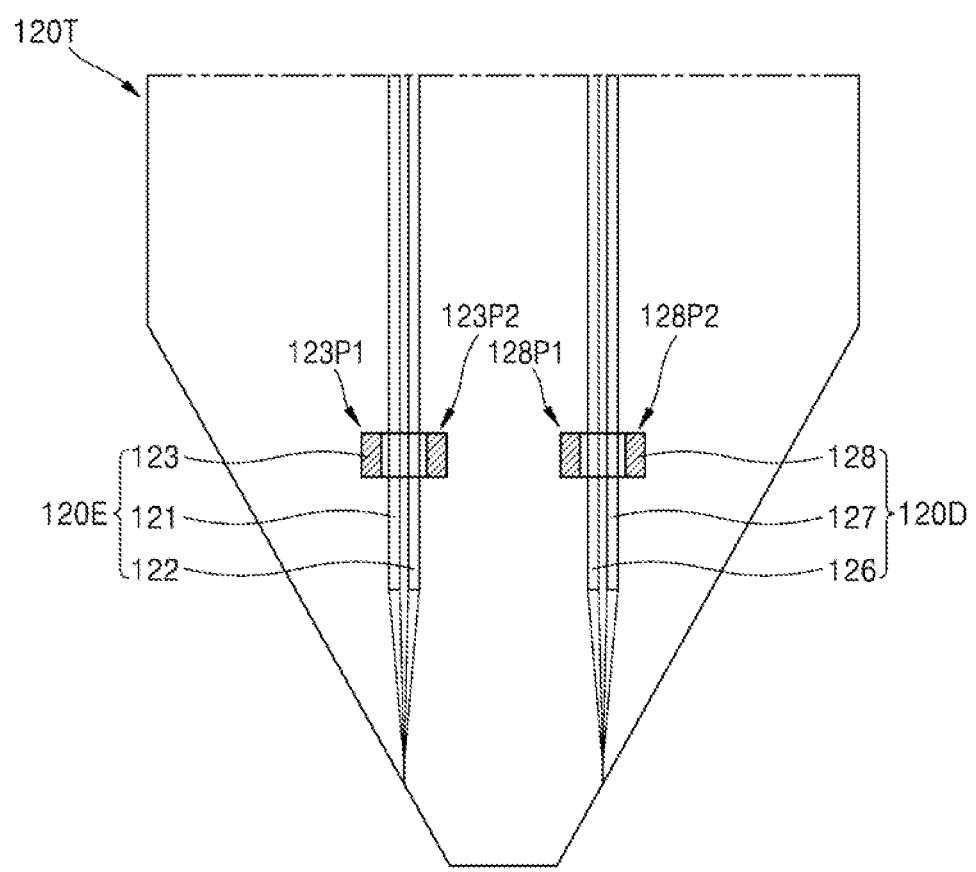
FIG. 3 is a partial cross-sectional view of a second probe tip included in an inspection apparatus.

FIG. 3 is a partial cross-sectional view of the second probe tip 120T included in the inspection apparatus 100.

Referring to FIGS. 1 and 3, the second probe 120 may include the second probe tip 120T and a second probe body 120B. An emitter 120E and a detector 120D may be embedded in the second probe tip 120T. The second probe body 120B may fix and mechanically support the second probe tip 120T and may provide an electrical path to the emitter 120E and the detector 120D.

The emitter 120E and the detector 120D may each be a dipole antenna. The emitter 120E may radiate a terahertz band inspection signal to the wafer W, and the detector 120D may detect a terahertz band signal irradiated from the emitter 120E and reflected by the wafer W.

The emitter 120E may include third and fourth electrodes 121 and 122 and a second photo switch 123 connected to the third and fourth electrodes 121 and 122. The second photo switch 123 may generate a photoelectric signal in response to an alignment ray AR reaching the second probe tip 120T.

The detector 120D may include fifth and sixth electrodes 126 and 127 and a third photo switch 128 connected to the fifth and sixth electrodes 126 and 127. The third photo switch 128 may generate a photoelectric signal in response to the alignment ray AR reaching the second probe tip 120T.

According to example embodiments, the second probe 120 may be aligned based on a position of any one of the second and third photo switches 123 and 128. The second probe 120 may be aligned in the inspection position based on a photoelectric signal generated by any one of the second and third photo switches 123 and 128. For example, the second probe 120 may be aligned to a position in which the photoelectric signal generated by the second photo switch 123 is maximized or to a position in which the photoelectric signal generated by the third photo switch 128 is maximized.

Similar to the first photo switch 113 described above (see FIG. 2), the second photo switch 123 may include a first portion 123P1 for increasing spatial resolution and a second portion 123P2 for increasing sensitivity. Similar to the first photo switch 113 described above (see FIG. 2), the third photo switch 128 may include a first portion 128P1 for increasing spatial resolution and a second portion 128P2 for increasing sensitivity.

According to example embodiments, an optical path of the alignment ray AR may be adjusted before the second probe 120 is aligned. Adjustment of the optical path of the alignment ray AR may be performed, for example, by rotation of the mirror 172, but is not limited thereto. Various optical elements for adjusting the optical path of the alignment ray AR may further be provided on the optical path of the alignment ray AR.

According to example embodiments, due to a difference in antenna configuration between the first probe 110 and the second probe 120, the optical path of the alignment ray AR for aligning the first probe 110 in the inspection position and the optical path of the alignment ray AR for aligning the second probe 120 in the inspection position may be different.

More specifically, referring to FIGS. 1 to 3, the first probe 110 includes the first photo switch 113 included in the receiver 110R, which is provided single, while the second probe 120 includes the second photo switch 123 included in the emitter 120E and the third photo switch 128 included in the detector 120D. Therefore, the positions of the first photo switch 113 when aligning the first probe 110 and the positions of the second and third photo switches 123 and 128 when aligning the second probe 120 may be different. According to example embodiments, before aligning the first probe 110 and before aligning the second probe 120, the optical path of the alignment ray AR may be adjusted using, for example, rotation of the mirror 172, etc. Accordingly, the reliability of alignment of the first and second probes 110 and 120 may be improved.

Referring back to FIG. 1, the first and second probes 110 and 120 may be mounted on the probe mount 130. According to example embodiments, the probe mount 130 may be configured so that at least two first and second probes 110 and 120 are coupled to each other. The probe mount 130 may have a shape complementary to the curved rail 140 to move along the curved rail 140. For example, when a surface of the curved rail 140 facing the probe mount 130 is a convex curved surface, a surface of the probe mount 130 facing the curved rail 140 may be a concave curved surface.

The probe mount 130 may include an actuator configured to drive the probe mount 130 along the curved rail 140. The actuator may be, for example, a piezoelectric motor.

As the probe mount 130 moves on the curved rail 140, any one of the first probe 110 and the second probe 120 may be arranged in the inspection position. In FIG. 1, the curved arrow CA1 indicates movement of the probe mount 130 on a curved line, and the curved arrow CA2 indicates movement of the first and second probes 110 and 120 on a curved line according to the movement of the probe mount 130 on the curved line. Here, the inspection position may be a position where the alignment ray AR is configured to arrive at the wafer W as shown, e.g., in FIG. 1. When one of the first probe 110 and the second probe 120 is aligned at the inspection position, one of the first probe 110 and the second probe 120 may detect a terahertz signal generated from the wafer W.

When the first probe 110 is placed in the inspection position, the second probe 120 may be placed in a standby position. When the second probe 120 is placed in the inspection position, the first probe 110 may be placed in the standby position. When any one of the first and second probes 110 and 120 is in the inspection position, a distance between any one of the first and second probes 110 and 120 and the wafer W in the Z direction may be in the range of about 10 μm to about 100 μm. According to example embodiments, a difference A in height between the probe tip (e.g., the first probe tip 110T of FIG. 1) in the inspection position and the probe tip (e.g., the second probe tip 120T of FIG. 1) in the standby position in the Z direction may be about 2 mm or greater but is not limited thereto.

According to example embodiments, because the difference A in height between the probe tip (e.g., the first probe tip 110T of FIG. 1) in the inspection position and the probe tip (e.g., the second probe tip 120T of FIG. 1) in the standby position in the Z direction is about 2 mm or greater, even when the wafer W has warpage, damage to the first and second probe tips 110T and 120T due to contact between the wafer W and the first and second probe tips 110T and 120T may be prevented.

In addition, the first and second probes 110 and 120 may each replace the other in the inspection position by moving the probe mount 130 along the curved rail 140, so that a reflection mode inspection and a transmission mode inspection may be selectively performed without a separate manual operation. Accordingly, contamination of the wafer W and the first and second probes 110 and 120 due to manual replacement of the first and second probes 110 and 120 may be prevented, and time due to manual replacement may be saved, and thus, an inspection rate may be improved.

According to example embodiments, the curved rail 140 may have a convex curved surface. According to example embodiments, the curved rail 140 may be a part of a circle, an ellipse, or a hyperbola, but is not limited thereto. When the curved rail 140 is a part of a circle (i.e., an arc), a pivot point PP of the curved rail 140 may be in a position apart from each of the components included in the inspection apparatus 100 including the curved rail 140. Here, the pivot point PP may be the center of the arc shape of the curved rail 140. Accordingly, a probe replacement system using the probe mount 130 and the curved rail 140 may be implemented in a narrow space, compared to a turret structure probe replacement system of the related art including a pivot point.

When the curved rail 140 is a part of a circle, a time $t_{sw}$ taken for switching between the first and second probes 110 and 120 is determined by a driving angle δ and a driving angular velocity ω of the probe mount 130 as shown in the following equation.

$$t_{sw} = \delta/\omega \quad \text{[Equation]}$$

According to example embodiments, the curved rail 140 may be coupled to the horizontal stage 145. The horizontal stage 145 may move in a horizontal direction (e.g., the X direction and/or the Y direction) along the horizontal rail 150. The horizontal stage 145 may move the curved rail 140 and the probe mount 130 in the horizontal direction. In some cases, the horizontal stage 145 may be omitted or may be driven along only one of the X-direction and the Y-direction. For example, the horizontal stage 145 may be driven only in the X direction, which is a direction perpendicular to a plane including the curved rail 140.

According to example embodiments, the horizontal rail 150 may be coupled to the vertical stage 155. The vertical stage 155 may move in a vertical direction (e.g., the Z direction) along the vertical rail 160. The vertical stage 155 may vertically move the horizontal rail 150, the curved rail 140, and the probe mount 130.

According to example embodiments, the probe mount 130, the horizontal stage 145, and the vertical stage 155 may be driven together so that any one of the first and second probes 110 and 120 may be accurately aligned in the inspection position. As described above, by driving the probe mount 130, the horizontal stage 145 and the vertical stage 155, the position of any one of the first and second probes 110 and 120 may be adjusted so that the photoelectric signal generated by any one of the first, second, and third photo switches 113, 123, and 128 (see FIGS. 2 and 3) is increased.

The alignment signal source 171 may generate and irradiate the alignment ray AR. The alignment ray AR may be reflected by the mirror 172 and directed to the inspection position of the first and second probes 110 and 120. The mirror 172 may be, for example, a rotatable mirror. A wavelength of the alignment ray AR may be, for example, in the range of about 400 nm to about 2000 nm, but is not limited thereto.

When any one of the first and second probes 110 and 120 is aligned in the inspection position, different portions of the wafer W may be inspected by driving the inspection stage 180. The inspection stage 180 may move the wafer W in the X direction, the Y direction, and the Z direction, or may rotate the wafer W about the Z direction as an axis.

The inspection signal source 190 may generate the inspection ray IR and irradiate the inspection ray IR toward the wafer W. Although not shown in detail, the inspection apparatus 100 may include a beam delivery optical system for transmitting the inspection ray IR generated by the inspection signal source 190 toward the wafer W. The beam delivery optical system may include various optical components such as a polarized or non-polarized beam splitter, a focusing lens, a collimating lens, a spherical mirror, and an aspherical mirror.

According to example embodiments, the inspection apparatus 100 may further include a controller for controlling the alignment of the first and second probes 110 and 120 by the probe mount 130, the horizontal stage 145, and the vertical stage 155, the driving of the mirror 172, the driving of the inspection stage 180, and the operation of the alignment signal source 171 and the inspection signal source 190 and a processor for reading and interpreting signals generated by the first and second probes 110 and 120. The controller and the processor may be implemented in hardware, firmware, software, or any combination thereof. For example, the controller and the processor may include computing devices such as workstation computers, desktop computers, laptop computers, and tablet computers. The controller and the processor may include simple controllers, complex processors such as microprocessors, CPUs, GPUs, processors configured by software, and dedicated hardware or firmware. The controller and the processor may be implemented by general-purpose computers, digital signal processors (DSPs), field programmable gate arrays (FPGAs), and application-specific hardware such as an application specific integrated circuit (ASIC).

According to some embodiments, the operation of the controller and the processor may be implemented as instructions stored on a machine-readable medium that may be read and executed by one or more processors. Here, the machine-readable medium may include any mechanism for storing and/or transmitting information in a form readable by a machine (e.g., a computing device). For example, the machine-readable medium may include read only memory (ROM), random access memory (RAM), magnetic disk storage mediums, optical storage mediums, flash memory devices, electrical, optical, acoustic, or other forms of propagated signals (for example, carrier waves, infrared signals, digital signals, etc.) and any other signals.

Firmware, software, routines, and instructions may also be configured to perform the operations described above for the controller and processor, or any of the processes described below. For example, the controller may be implemented by software generating a signal for performing alignment of the first and second probes 110 and 120 by the probe mount 130, the horizontal stage 145, and the vertical stage 155, generating a signal for driving the mirror 172, generating a signal for driving the inspection stage 180, and generating a signal for controlling oscillation of the alignment signal source 171 and the inspection signal source 190. The processor may be implemented by software configured to determine whether there is an abnormality in the process performed on the wafer W from signals measured by the first and second probes 110 and 120. However, this is for convenience of description, and operations of the controller and the processor described above may be caused by other devices executing computing devices, processors, firmware, software, routines, instructions, and the like.

Above, the inspection apparatus 100 including the transmission mode probe 110 and the reflection mode probe 120 has been described, but those skilled in the art may easily achieve an inspection apparatus including two transmission mode probes mounted on the probe mount 130 and an inspection apparatus including two reflection mode probes mounted on the probe mount 130 or three or more different types of probes mounted on the probe mount 130.

In an embodiment, each of the first and second probes 110 and 120 may be a transmission mode probe or a reflection mode probe. In this case, the first and second probes 110 and 120 may have different characteristics. Each of the first and second probes 110 and 120 may be a transmission mode probe or a reflection mode probe, and may be different in, for example, a gap between adjacent electrodes included in each of the receiver, detector, and emitter, spatial resolution, a size and type of the photo switches, wavelength bands in which the photo switches generate a photoelectric signal, noise characteristics, a magnitude of a signal in response to the same alignment ray AR, operating power of the alignment signal source 171, which is available, and a connection method for a peripheral circuit.

When the inspection apparatus includes three or more probes, the probes included in the inspection apparatus may be transmission mode probes having different characteristics or reflection mode probes having different characteristics. As another example, some of the probes included in the inspection apparatus may be reflection mode probes, and the others may be transmission mode probes. As another example, the probes included in the inspection apparatus may be transmission mode probes that are substantially the same as each other, or reflection mode probes that are substantially the same as each other.

Figure 4:
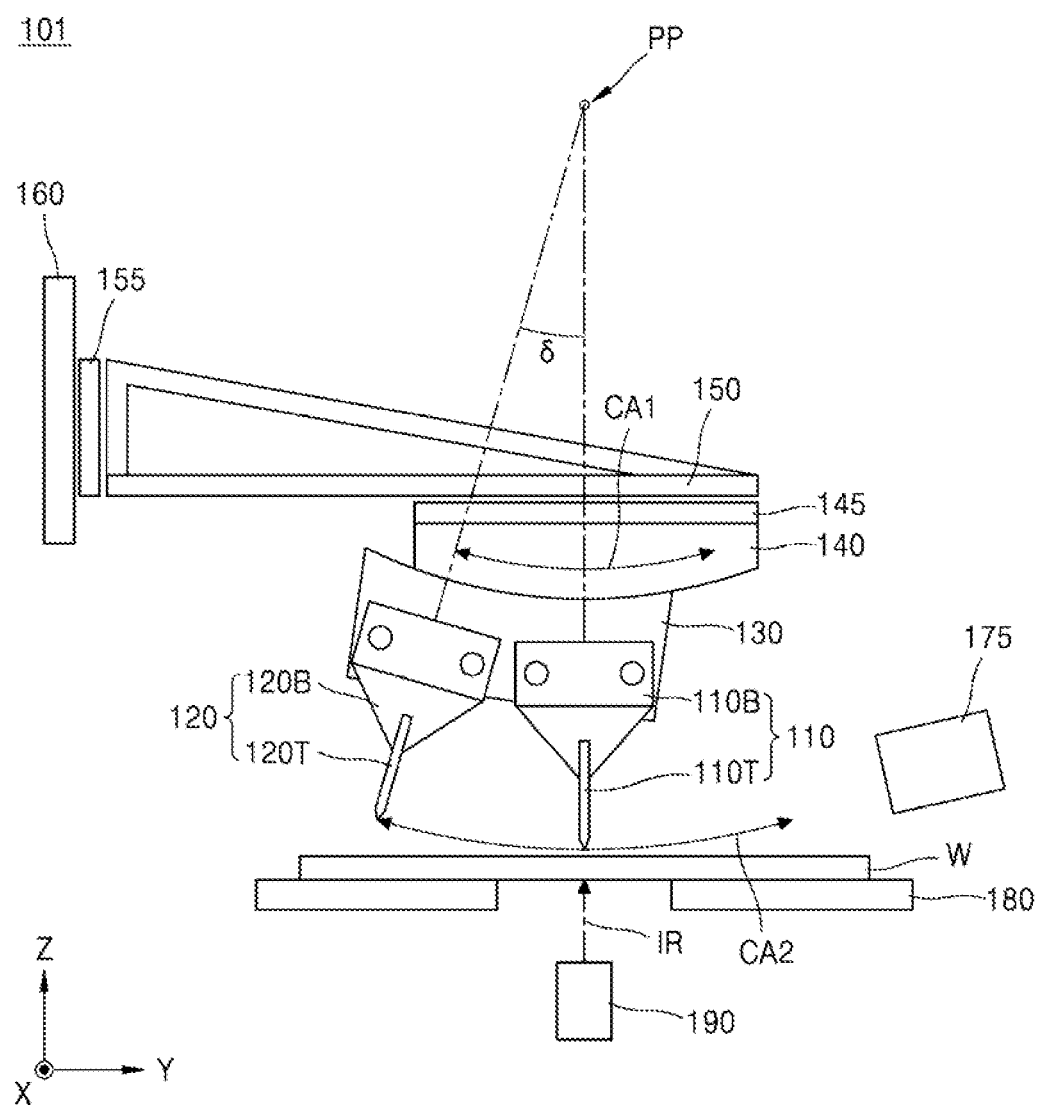
FIG. 4 is a view illustrating an inspection apparatus according to example embodiments.

FIG. 4 is a view illustrating an inspection apparatus 101 according to example embodiments.

For convenience of explanation, repeated descriptions previously given with reference to FIGS. 1 to 3 are omitted, and differences are mainly described.

Referring to FIG. 4, the inspection apparatus 101 may include first and second probes 110 and 120, a probe mount 130, a curved rail 140, a horizontal stage 145, a horizontal rail 150, a vertical stage 155, a vertical rail 160, an inspection stage 180, and an inspection signal source 190.

According to example embodiments, the inspection apparatus 101 may further include an alignment camera 175. According to example embodiments, the alignment camera 175 may generate images of the first and second probes 110 and 120. According to example embodiments, each of the first and second probes 110 and 120 of the inspection apparatus 101 may be aligned in an inspection position by an alignment method of an image base. According to example embodiments, each of the first and second probes 110 and 120 of the inspection apparatus 101 may be aligned based on the image generated by the alignment camera 175.

Figure 5:
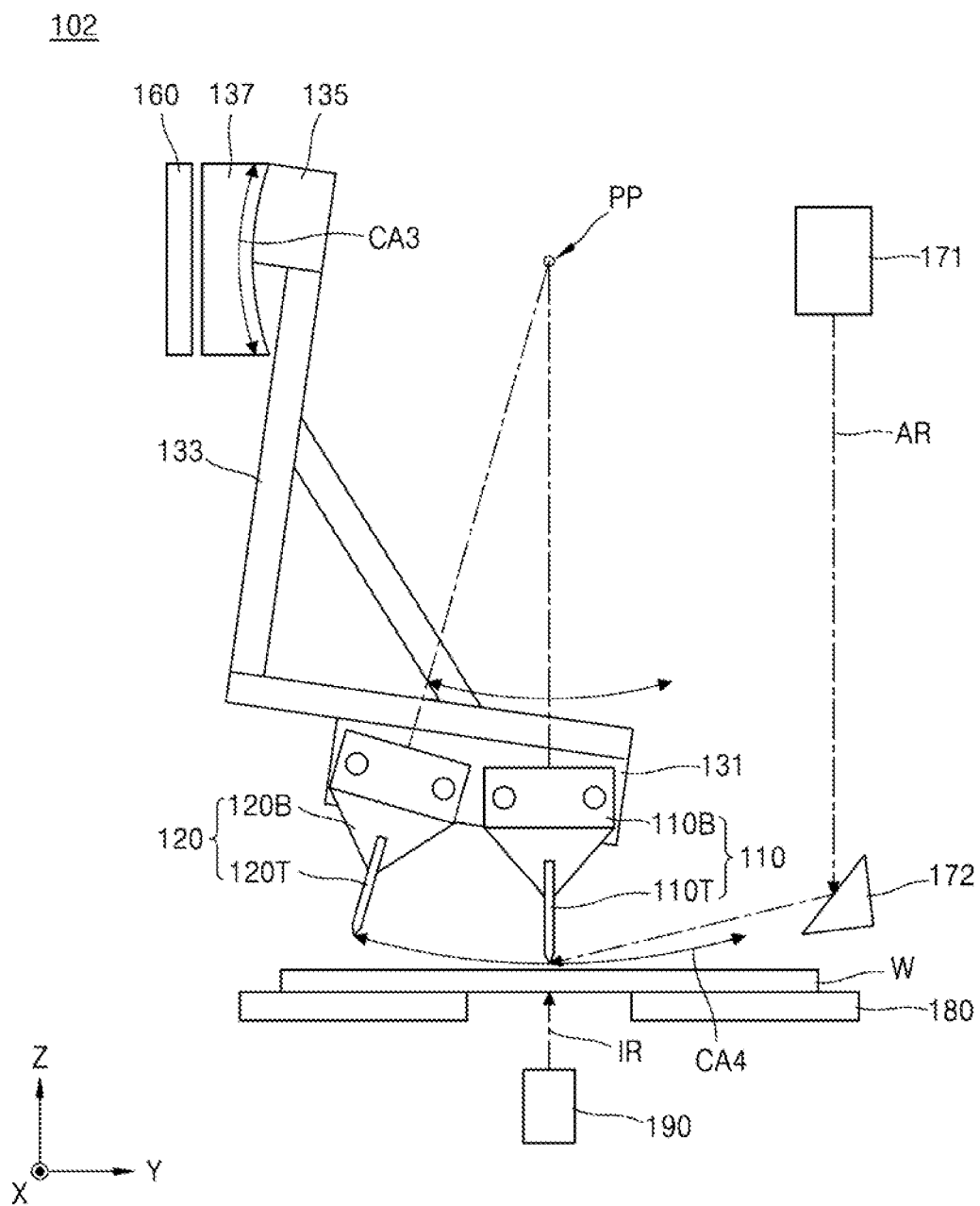
FIG. 5 is a view illustrating an inspection apparatus according to example embodiments.

FIG. 5 is a view illustrating an inspection apparatus 102 according to example embodiments.

For convenience of explanation, repeated descriptions previously given with reference to FIGS. 1 to 3 are omitted, and differences are mainly described.

Referring to FIG. 5, the inspection apparatus 102 includes first and second probes 110 and 120, a probe mount 131, an L-shaped arm 133, an actuator 135, a curved rail 137, a vertical rail 160, an inspection stage 180, and an inspection signal source 190.

According to example embodiments, the probe mount 131 may be coupled to the L-shaped arm 133. Accordingly, the probe mount 131 may be fixed to the L-shaped arm 133, without being driven along the curved rail 137. Also, although not explicitly shown in the drawing, a horizontal stage configured to drive the probe mount 131 in a horizontal direction may be further provided between the probe mount 131 and the L-shaped arm 133.

The L-shaped arm 133 may be connected to the actuator 135 moving along the curved rail 137. The actuator 135 may be, for example, a piezoelectric motor. As the L-shaped arm 133 moves along the curved rail 137, any one of the first and second probes 110 and 120 may be aligned in the inspection position and the other of the first and second probes 110 and 120 may be aligned in a standby position. In FIG. 5, the curved arrow CA3 indicates a movement of the actuator 135 on a curved line, and the curved arrow CA4 indicates a movement of the first and second probes 110 and 120 on a curved line according to the movement of the actuator 135.

The curved rail 137 may have, for example, a concave curved surface. The actuator 135 may have a curved surface (e.g., a convex curved surface) complementary to that of the curved rail 137 to move along the curved rail 137. The curved rail 137 may be configured to move in a vertical direction (e.g., the Z direction) along the vertical rail 160.

Figure 6:
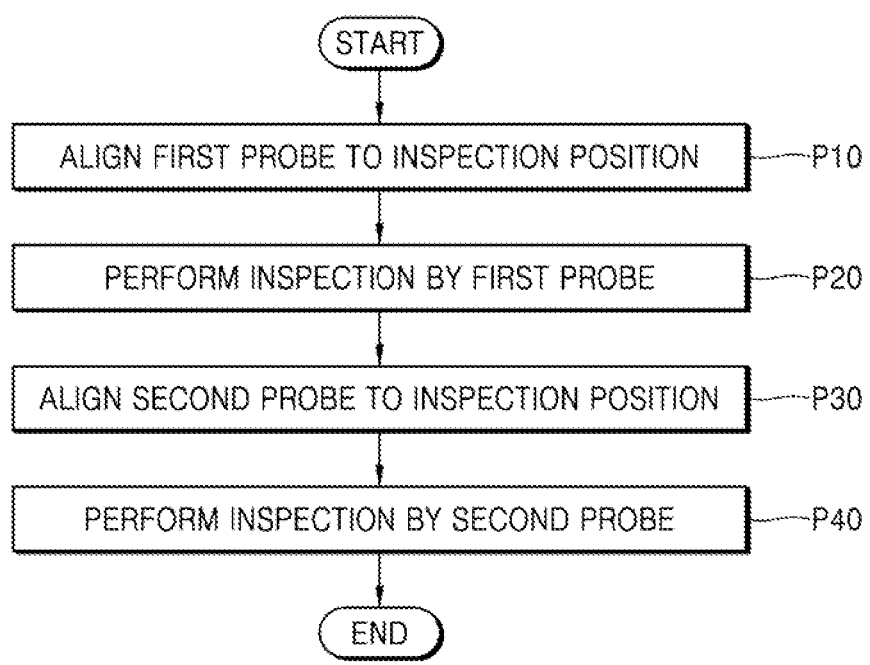
FIG. 6 is a flowchart illustrating an inspection method according to example embodiments.

FIG. 6 is a flowchart illustrating an inspection method according to example embodiments.

Referring to FIGS. 1, 2, and 6, the first probe 110 may be aligned in an inspection position in P10.

The first probe 110 may be aligned by driving the probe mount 130, the horizontal stage 145, and the vertical stage 155. After the first probe 110 is roughly aligned in a position adjacent to the inspection position in first alignment, the first probe 110 may be precisely aligned in the inspection position based on the alignment ray AR generated by the alignment signal source 171 in a second alignment.

The first alignment includes moving the first probe 110 based on data previously set for driving of the probe mount 130, the horizontal stage 145, and the vertical stage 155 to align the first probe 110 in the inspection position.

The second alignment may include aligning the first probe 110 based on the photoelectric signal generated by the first photo switch 113 included in the receiver 110R embedded in the first probe tip 110T of the first probe 110 in response to the alignment ray AR as described above. In an embodiment, the second alignment may include aligning the first probe 110 to a position in which the photoelectric signal generated by the first photo switch 113 is maximized.

According to example embodiments, the optical path of the alignment ray AR may be adjusted by rotating the mirror 172 before the first probe 110 is aligned to the inspection position, but is not limited thereto.

When the first probe 110 is aligned in the inspection position, the second probe 120 may be placed in the standby position vertically (e.g., in the Z direction) apart from the inspection position by at least about 2 mm.

Subsequently, in P20, the wafer W may be inspected using the first probe 110. The inspection of the wafer W may be a transmission mode inspection. In the transmission mode inspection, the first probe 110 may detect the inspection ray IR that is irradiated by the inspection signal source 190 and then transmitted through the wafer W.

Next, referring to FIGS. 1, 3, and 6, in P30, the second probe 120 may be aligned in the inspection position.

The second probe 120 may be aligned by driving the probe mount 130, the horizontal stage 145, and the vertical stage 155. After the second probe 120 is roughly aligned in a position adjacent to the inspection position in first alignment, the second probe 120 may be precisely aligned in the inspection position based on the alignment ray AR generated by the alignment signal source 171 in a second alignment.

The first alignment includes moving the second probe 120 based on data previously set for driving of the probe mount 130, the horizontal stage 145, and the vertical stage 155 to align the second probe 120 in the inspection position.

The second alignment may include aligning the second probe 120 based on a photoelectric signal generated by any one of the second photo switch 123 included in the emitter 120E embedded in the second probe tip 120T of the second probe 120 and the third photo switch 128 included in the detector 120D in response to the alignment ray AR as described above. In an embodiment, the second alignment may include aligning the second probe 120 to a position in which the photoelectric signal generated by any one of the second and third photo switches 123 and 128 is maximized.

According to example embodiments, the optical path of the alignment ray AR may be adjusted by rotating the mirror 172 before the second probe 120 is aligned to the inspection position, but is not limited thereto.

When the second probe 120 is aligned in the inspection position, the first probe 110 may be placed in the standby position vertically (e.g., in the Z direction) apart from the inspection position by at least about 2 mm.

Subsequently, in P40, the wafer W may be inspected using the second probe 120. The inspection of the wafer W may be a reflection mode inspection. In the reflection mode inspection, the emitter 120E may irradiate an inspection signal having a wavelength in the range of about 0.1 THz to about 10 THz on the wafer W, and the detector 120D may detect the inspection signal irradiated from the emitter 120E and reflected by the wafer W.

While the disclosure has been particularly shown and described with reference to embodiments thereof, it will be understood that various changes in form and details may be made therein without departing from the spirit and scope of the following claims.

What is claimed is:

1. An inspection apparatus comprising:
   an inspection signal source configured to irradiate a wafer with an inspection ray having a frequency in a range of about 0.1 terahertz (THz) to 10 THz;
   a curved rail;
   a probe mount configured to move along the curved rail; and
   a first probe and a second probe coupled to the probe mount,
   wherein the first probe is configured to detect the inspection ray transmitted through the wafer, and
   wherein the curved rail has a curved surface that is convex toward the first probe and the second probe.

2. The inspection apparatus of claim 1, wherein the probe mount comprises a piezoelectric motor for moving along the curved rail, and
   wherein the probe mount has a curved surface shape complementary to a shape of the curved rail.

3. The inspection apparatus of claim 1, wherein the probe mount moves along the curved rail to align the first probe or the second probe to a position for inspection of the wafer.

4. The inspection apparatus of claim 1, wherein the first probe comprises a first probe tip in which a receiver is embedded, the receiver being configured to detect the inspection ray transmitted through the wafer, and
   wherein the receiver comprises:
      a first electrode and a second electrode; and
      a first photo switch connected to the first electrode and the second electrode.

5. The inspection apparatus of claim 4, wherein the second probe comprises a second probe tip in which an emitter and a detector are embedded, the emitter being configured to emit a signal having the frequency in the range of 0.1 THz to 10 THz to the wafer and the detector being configured to detect the signal emitted from the emitter and reflected by the wafer,
   wherein the emitter comprises:
      a third electrode and a fourth electrode; and
      a second photo switch connected to the third electrode and the fourth electrode, and
   wherein the detector comprises:
      a fifth electrode and a sixth electrode; and
      a third photo switch connected to the fifth electrode and the sixth electrode.

6. The inspection apparatus of claim 5, wherein a height difference between the first probe tip and the second probe tip in a direction perpendicular to an upper surface of the wafer is 2 mm or greater.

7. The inspection apparatus of claim 5, further comprising:
   an alignment signal source configured to irradiate any one of the first to third photo switches with an alignment ray,
   wherein each of the first to third photo switches is configured to generate a photoelectric signal in response to irradiation by the alignment ray.

8. The inspection apparatus of claim 7, wherein a wavelength of the alignment ray is within a range of 400 nm to 2000 nm.

9. The inspection apparatus of claim 7, wherein the probe mount is configured to align the first probe or the second probe in a position for inspecting the wafer based on the photoelectric signal generated by any one of the first to third photo switches.

10. The inspection apparatus of claim 7, wherein the probe mount is configured to align the first probe or the second probe to a position in which the photoelectric signal generated by the any one of the first to third photo switches is maximized.

11. An inspection apparatus comprising:
    an inspection signal source configured to irradiate a wafer with an inspection ray having a frequency in a range of 0.1 terahertz (THz) to 10 THz;
    an L-shaped arm configured to move along a curved rail;
    a probe mount coupled to the L-shaped arm; and a first probe and a second probe coupled to the probe mount, wherein the first probe is configured to detect the inspection ray transmitted through the wafer, and wherein the curved rail has a curved surface that is concave toward the L-shaped arm.

12. The inspection apparatus of claim 11, wherein the first probe comprises a first probe tip in which a receiver is embedded, the receiver being configured to detect the inspection ray transmitted through the wafer, and wherein the receiver comprises:
 a first electrode and a second electrode; and
 a first photo switch connected to the first electrode and the second electrode.

13. The inspection apparatus of claim 12, wherein the second probe comprises a second probe tip comprising an emitter and a detector, the emitter being configured to emit a signal having the frequency in the range of 0.1 THz to 10 THz to the wafer and the detector being configured to detect the signal emitted from the emitter and reflected by the wafer, wherein the emitter comprises:
 a third electrode and a fourth electrode; and
 a second photo switch connected to the third electrode and the fourth electrode, and wherein the detector comprises:
 a fifth electrode and a sixth electrode; and
 a third photo switch connected to the fifth electrode and the sixth electrode.

14. The inspection apparatus of claim 13, wherein a height difference between the first probe tip and the second probe tip in a direction perpendicular to an upper surface of the wafer is 2 mm or greater.

15. The inspection apparatus of claim 13, further comprising:

an alignment signal source configured to irradiate any one of the first to third photo switches with an alignment ray, wherein each of the first to third photo switches is configured to generate a photoelectric signal in response to irradiation by the alignment ray.

16. An inspection apparatus comprising:

an inspection signal source configured to irradiate a wafer with an inspection ray having a frequency in a range of about 0.1 terahertz (THz) to 10 THz;

a curved rail;

a probe mount configured to move along the curved rail;

a first probe and a second probe coupled to the probe mount; and an alignment signal source configured to irradiate any one of the first and second probes with an alignment ray, wherein the first probe is configured to detect the inspection ray transmitted through the wafer.

17. The inspection apparatus of claim 16, wherein the first probe comprises a first probe tip in which a receiver is embedded, the receiver being configured to detect the inspection ray transmitted through the wafer, and wherein the receiver comprises:
 a first electrode and a second electrode; and
 a first photo switch connected to the first electrode and the second electrode.

18. The inspection apparatus of claim 17, wherein the second probe comprises a second probe tip in which an emitter and a detector are embedded, the emitter being configured to emit a signal having the frequency in the range of 0.1 THz to 10 THz to the wafer and the detector being configured to detect the signal emitted from the emitter and reflected by the wafer, wherein the emitter comprises:
 a third electrode and a fourth electrode; and
 a second photo switch connected to the third electrode and the fourth electrode, and wherein the detector comprises:
 a fifth electrode and a sixth electrode; and
 a third photo switch connected to the fifth electrode and the sixth electrode.

19. The inspection apparatus of claim 18, wherein each of the first to third photo switches is configured to generate a photoelectric signal in response to irradiation by the alignment ray.

20. The inspection apparatus of claim 19, wherein the probe mount is configured to align the first probe or the second probe to a position in which the photoelectric signal generated by the any one of the first to third photo switches is maximized.

* * * * *